(12) United States Patent
Jung et al.

(10) Patent No.: US 8,158,989 B2
(45) Date of Patent: *Apr. 17, 2012

(54) ORGANIC LIGHT EMITTING DIODE DISPLAY

(75) Inventors: Kwang-Chul Jung, Seongnam-si (KR); In-Su Joo, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/699,757

(22) Filed: Feb. 3, 2010

(65) Prior Publication Data

US 2010/0134389 A1 Jun. 3, 2010

Related U.S. Application Data

(63) Continuation of application No. 11/413,240, filed on Apr. 28, 2006, now Pat. No. 7,683,382.

(30) Foreign Application Priority Data

May 2, 2005 (KR) .................. 10-2005-0036756

(51) Int. Cl.
*H01L 27/15* (2006.01)
(52) U.S. Cl. ............... 257/83; 257/40; 257/79; 257/88; 257/89; 257/E27.1
(58) Field of Classification Search .............. 257/40, 257/79, 83, 88, 89
See application file for complete search history.

(56) References Cited

U.S. PATENT DOCUMENTS 7,119,367 B2 10/2006 Yuki et al.
7,683,382 B2 * 3/2010 Jung et al. .................. 257/83
2004/0108818 A1 6/2004 Cok et al.
2004/0201558 A1 10/2004 Arnold et al.
2005/0087740 A1 4/2005 Matsumoto et al.
2005/0087744 A1 4/2005 Koo et al.
2005/0162079 A1 7/2005 Sakamoto
2005/0218970 A1 10/2005 Kawai et al.

FOREIGN PATENT DOCUMENTS

| CN | 1384696 | 12/2002 |
|---|---|---|
| CN | 1413069 | 4/2003 |
| JP | 63-180936 A | 7/1988 |
| JP | 10-039791 | 8/1995 |
| JP | 07-306656 A | 11/1995 |
| JP | 10-039791 | 2/1998 |
| JP | 2000-235891 | 8/2000 |
| JP | 2000227770 | 8/2000 |
| JP | 2001-109399 | 4/2001 |
| JP | 2001-134214 A | 5/2001 |
| JP | 2002-236466 A | 8/2002 |
| JP | 2003-077663 | 3/2003 |
| JP | 2003-092183 A | 3/2003 |
| JP | 2003-218357 A | 7/2003 |

(Continued)

*Primary Examiner* — Wai Sing Louie
(74) *Attorney, Agent, or Firm* — Innovation Counsel LLP

(57) ABSTRACT

An organic light emitting diode display includes a plurality of pixels. Each pixel includes a light emitting element and a driving transistor coupled to the light emitting element. The pixels may be arranged in a matrix. The pixels include first pixels, second pixels, and third pixels, the driving transistors of the first to the third pixels occupy different areas, and the light emitting elements of the first to the third pixels occupy substantially equal area.

23 Claims, 6 Drawing Sheets

FOREIGN PATENT DOCUMENTS

| | | |
|---|---|---|
| JP | 2004-117431 A | 4/2004 |
| JP | 2004-335169 A | 11/2004 |
| JP | 2005-515505 A | 5/2005 |
| KR | 2000-0073118 | 5/2000 |
| KR | 2001-0014509 | 2/2001 |
| KR | 2001-0113334 | 12/2001 |
| KR | 2002-0022281 | 3/2002 |
| KR | 2003-0024076 | 3/2003 |
| KR | 2004-0024484 | 3/2004 |
| KR | 1020060114477 | 7/2006 |
| WO | 03/060870 A1 | 7/2003 |
| WO | 2004-073356 A1 | 8/2004 |

* cited by examiner

ORGANIC LIGHT EMITTING DIODE DISPLAY

CROSS-REFERENCE TO RELATED APPLICATIONS

This application is a continuation of U.S. patent application Ser. No. 11/413,240, filed Apr. 29, 2006 now U.S. Pat. No. 7,683,382, which claims priority upon Korean Patent Application No. 10-2005-0036756, filed on May 2, 2005, in the Korean Intellectual Property Office, the disclosure of which is incorporated herein by reference.

BACKGROUND OF THE INVENTION

1. Field of the Invention

The present invention relates to light emitting diodes, and in particular, an organic light emitting diode display.

2. Description of Related Art

The recent trend to thin, lightweight personal computers and televisions sets created demands for thin, lightweight display devices. Currently, flat panel displays are satisfying these demands and are being substituted for conventional cathode ray tubes (CRT).

Exemplary flat panel displays include liquid crystal displays (LCD), field emission displays (FED), organic light emitting diode (OLED) displays, and plasma display panels (PDP). The OLED display appears to be the most promising of the flat panel displays, because of its low power consumption, fast response time, wide viewing angle, and high contrast ratio.

In general, an OLED display is a self-emissive display device, which includes two electrodes and an organic light emitting layer interposed between the two electrodes, with one electrode (anode) injecting holes into the light emitting layer and the other electrode (cathode) injecting electrons. Excitons are formed when the injected electrons and holes recombine, and emit light by discharging energy.

Because the red, green, and blue light emitting materials currently employed in OLEDs display exhibit different emission efficiencies, there is a need to design and produce pixels based on the lowest emission efficiency, in order to control red, green, and blue light emissions in an equivalent manner, and thereby decreasing pixel aperture ratio.

SUMMARY OF THE INVENTION

An organic light emitting diode display is provided, which includes a plurality of pixels. Each pixel includes a light emitting element and a driving transistor coupled to the light emitting element. The pixels may be arranged in a matrix.

According to an embodiment of the present invention, the pixels include first pixels, second pixels, and third pixels, the driving transistors of the first to the third pixels occupy different areas, and the light emitting elements of the first to the third pixels occupy substantially equal area.

According to another embodiment of the present invention, the pixels include first pixels, second pixels, and third pixels, the driving transistors of the first to the third pixels occupy different areas, and the matrix includes a first pixel column including second pixels and a second pixel column including the first pixels and the second pixels that are alternately arranged.

According to another embodiment of the present invention, the matrix includes a plurality of pixel rows, and each pixel row has a curved boundary and a straight boundary.

According to another embodiment of the present invention, the organic light emitting diode display further includes a plurality of gate lines and a plurality of data lines. The gate lines and the data lines are coupled to the pixels and define areas of the pixels, and the gate lines include periodically-curved gate lines and straight gate lines that are alternately arranged.

According to another embodiment of the present invention, the pixels comprise a first pixel, a second pixel, and a third pixel, and the first pixel, the second pixel, and third pixels have different lengths in a predetermined direction.

An organic light emitting diode display according to another embodiment of the present invention includes: a substrate; a light emitting element formed on the substrate; a driving voltage line formed on the substrate; a driving transistor coupled to the driving voltage line and the light emitting element; a gate line and a data line formed on the substrate; and a switching transistor coupled to the gate line and the data line, wherein the driving transistor has a serpentine channel.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
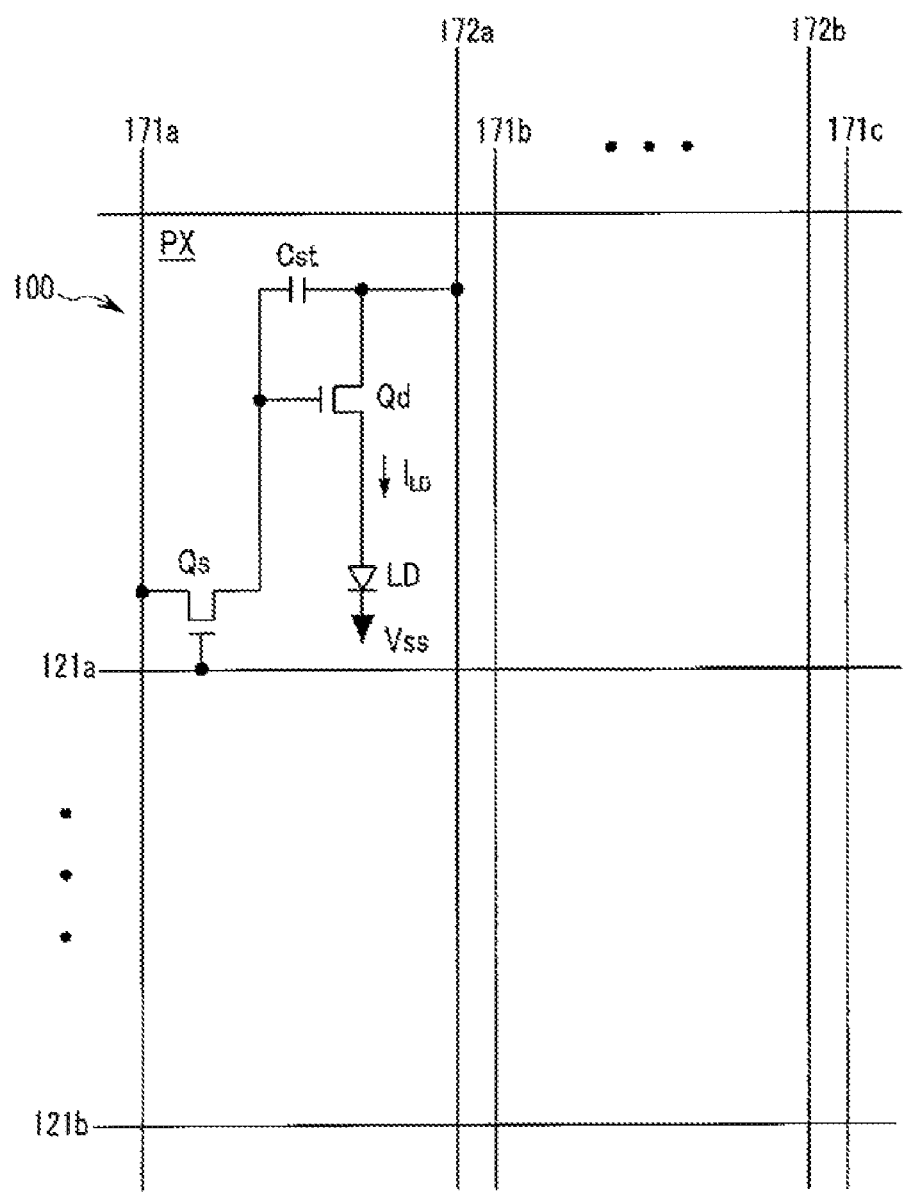
FIG. 1 is an equivalent circuit diagram of an OLED display pixel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Referring to FIG. 1, exemplary OLED display includes a plurality of pixels arranged substantially in a matrix, with each pixel PX 100 being connected to signal lines 121*a*, 171*a* and 172*a*. With respect to pixel PX 100, exemplary gate line 121*a* transmits a gate signal (or scanning signal), data line 171*a* transmits a data signal, and driving voltage line 172*a* transmits a driving voltage. In an OLED display formed from a plurality of pixels PX 100, gate lines 121*a-b* extend substantially in a first direction and substantially parallel to each other as rows, while data lines 171*a-c* and driving voltage lines 172*a-b* extend substantially in a second direction and substantially parallel to each other, as columns. Typically, each pixel PX 100 can include switching transistor Qs, driving transistor Qd, capacitor Cst, and OLED LD. Switching transistor Qs can have a control terminal connected to gate line 121*a*, an input terminal connected to data line 171*a*, and an output terminal connected to driving transistor Qd. Switching transistor Qs transmits a data signal applied to data line 171a to driving transistor Qd in response to a gate signal applied to gate line 121a. Driving transistor Qd can have a control terminal connected to switching transistor Qs, an input terminal connected to driving signal line 172a, and an output terminal connected to the OLED LD. Driving transistor Qd drives an output current ILD having a magnitude that corresponds to the voltage difference between the control terminal and the output terminal thereof. Capacitor Cst can be connected between the control terminal and the output terminal of driving transistor Qd. Capacitor Cst can store a data signal applied to the control terminal of driving transistor Qd and maintains the data signal after switching transistor Qs turns off. OLED LD can have an anode connected to the output terminal of driving transistor Qd and a cathode connected to a common voltage Vss. OLED LD typically emits light having an intensity corresponding to an output current ILD of driving transistor Qd, with the light thereby creating a displayed image. Desirably, switching transistor Qs and driving transistor Qd are n-channel field effect transistors (FETs). However, at least one of switching transistor Qs and driving transistor Qd may be a p-channel FET. In addition, the connections among transistors Qs and Qd, capacitor Cst, and OLED LD may be modified.

Figure 2:
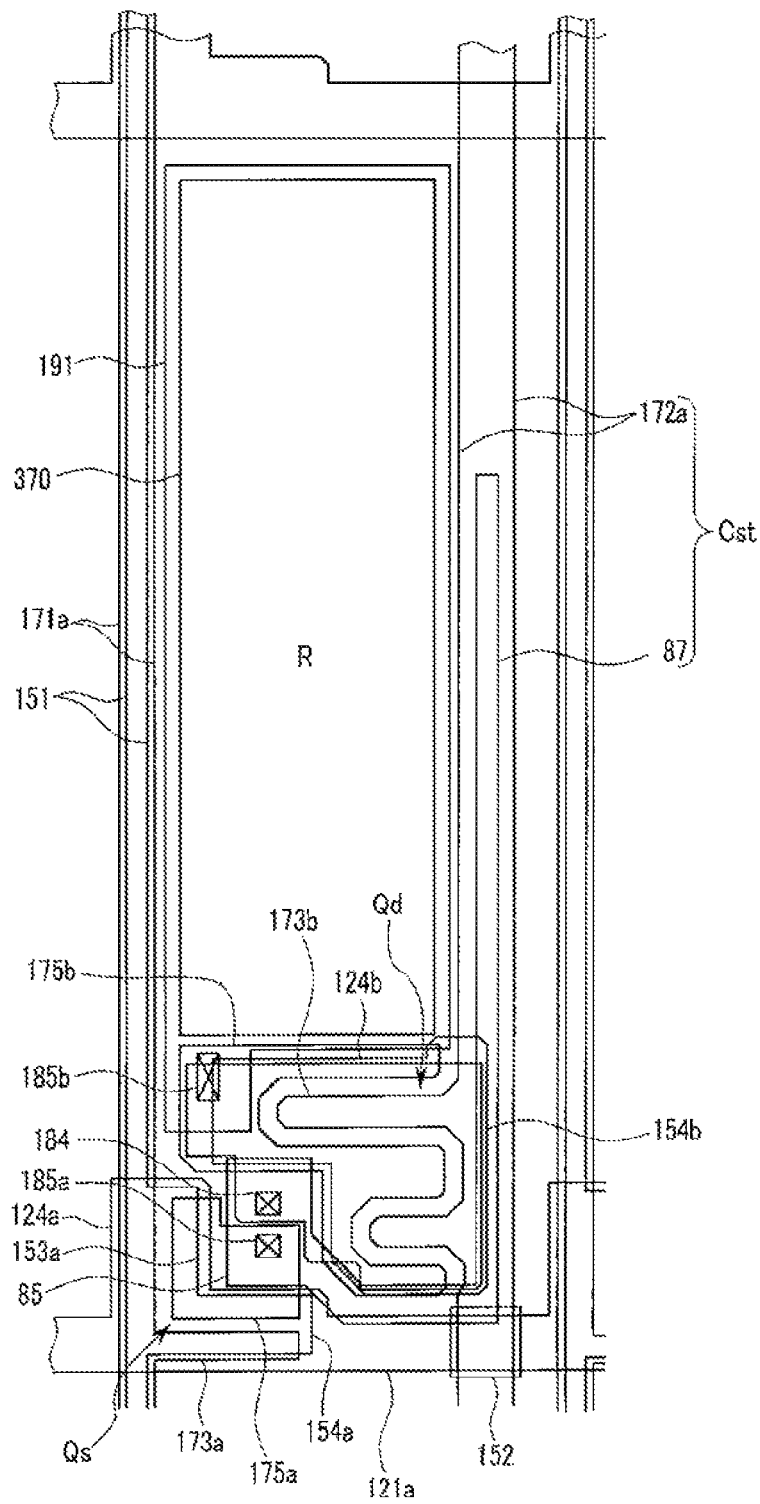
FIGS. 2, 3 and 4 are layout views of different pixels in an OLED display according to an embodiment of the present invention.
Figure 3:
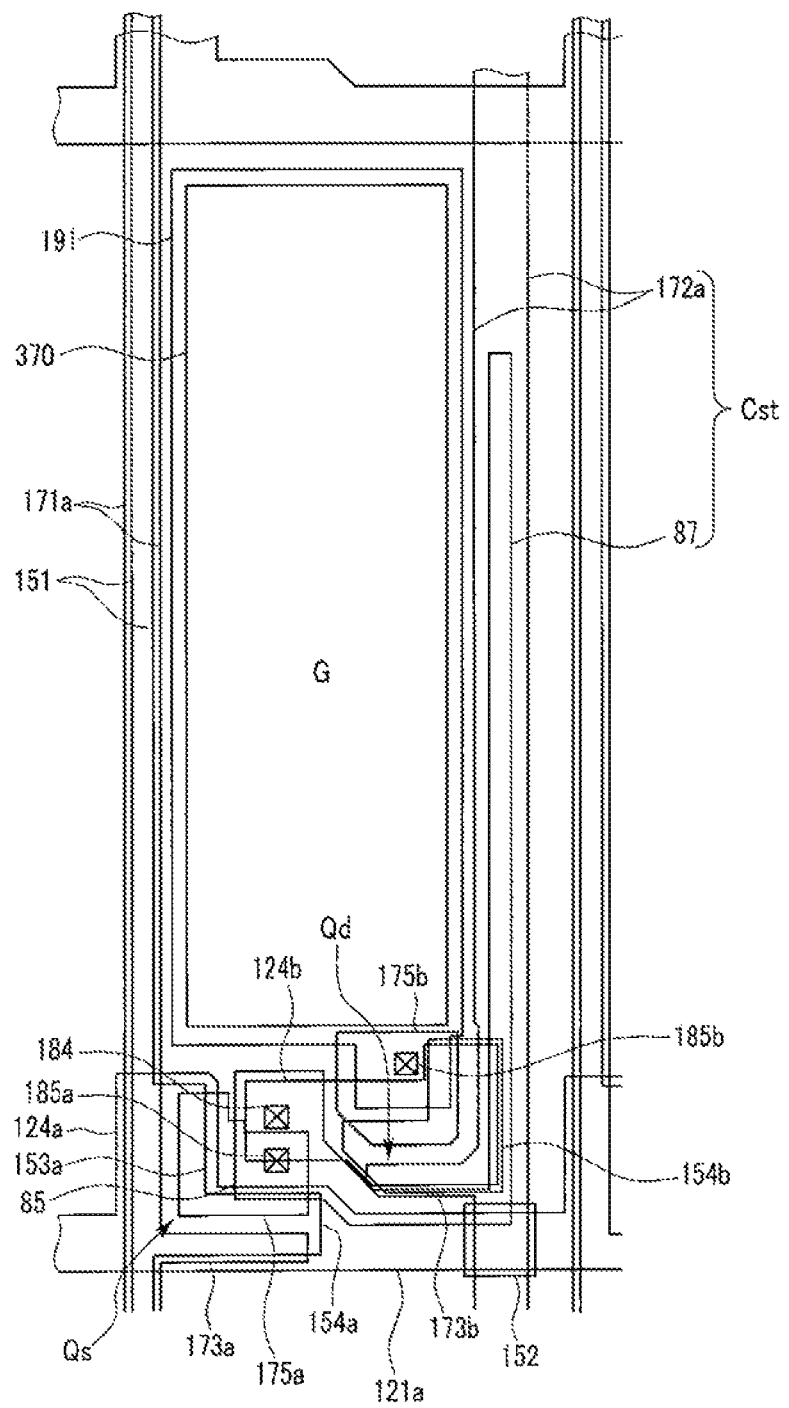
Figure 4:
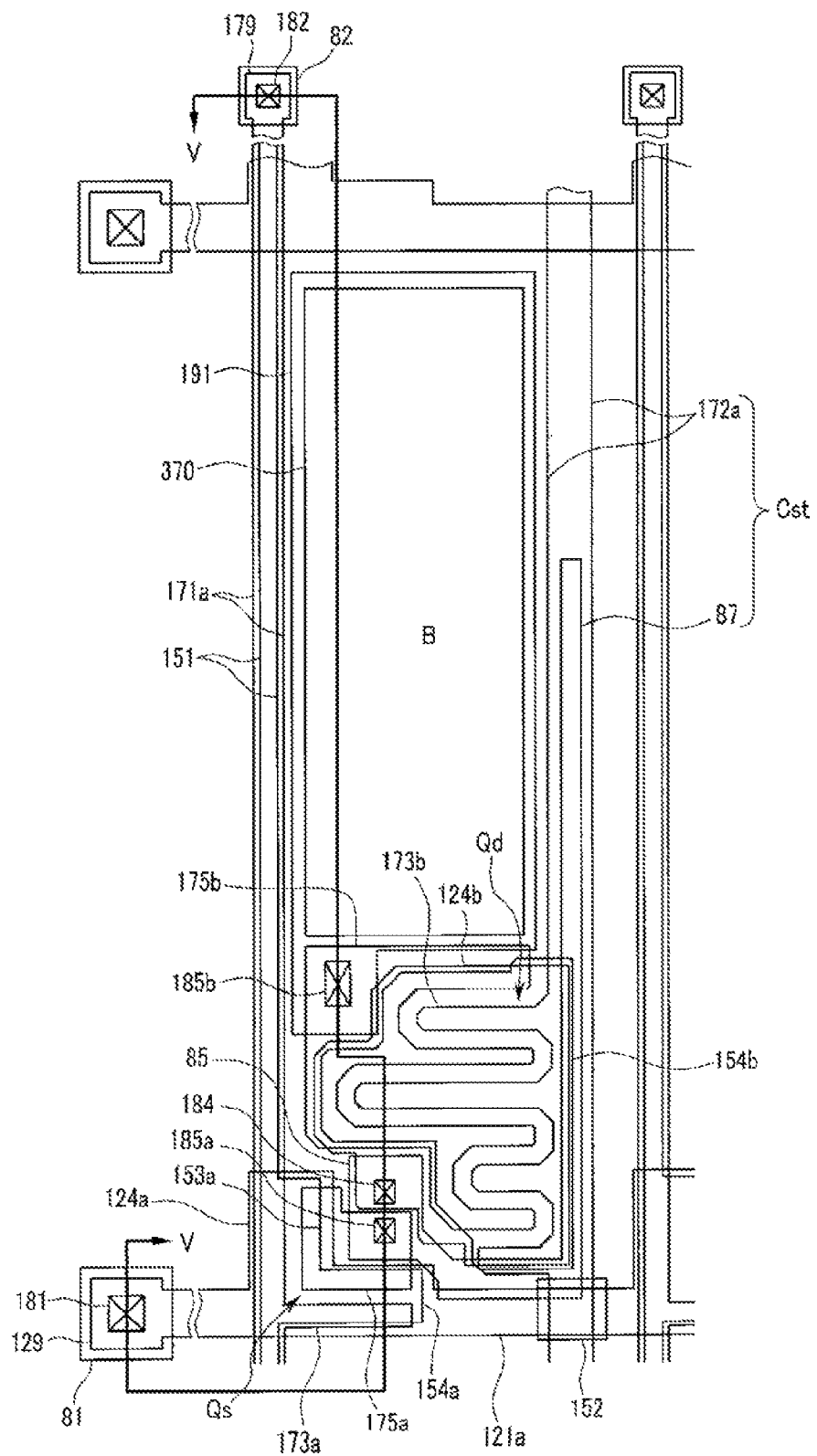
Figure 5:
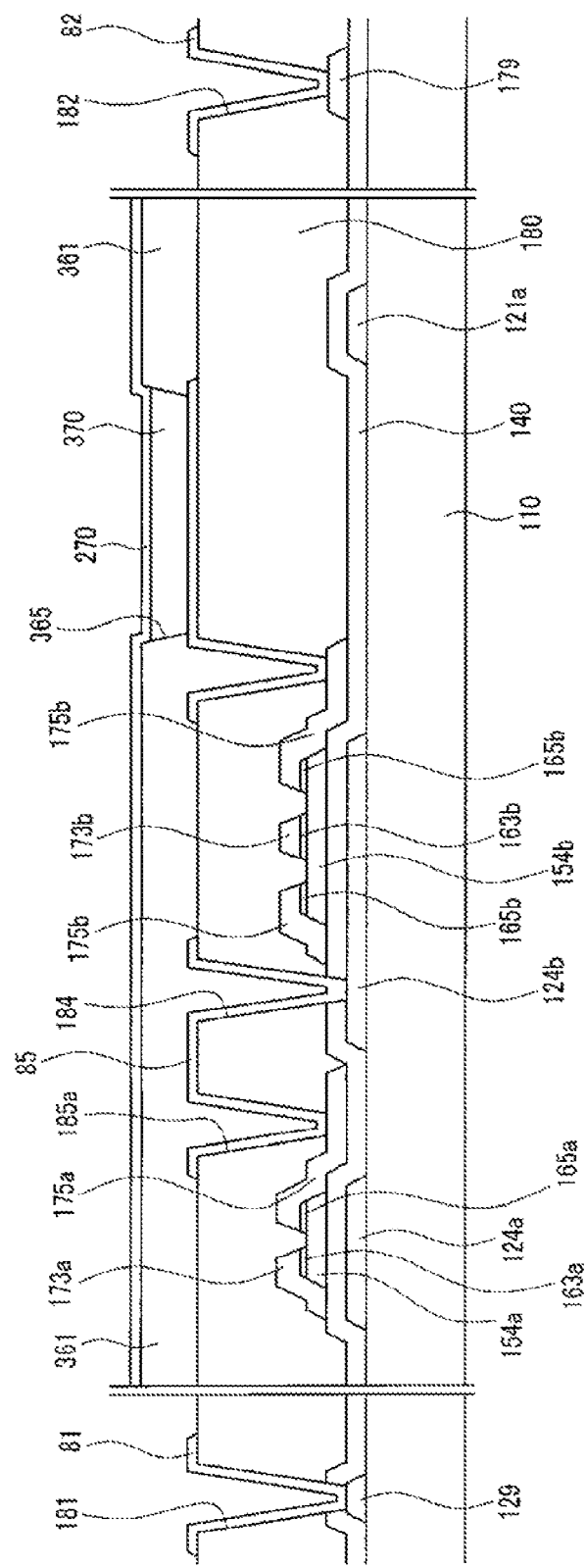
FIG. 5 is a sectional view of the pixel shown in FIG. 4 taken along the line V-V.

FIGS. 2-5 present detailed structures of pixel PX 100 of the OLED display shown in FIG. 1, in which FIGS. 2, 3 and 4 are layout views of different OLED display pixels and FIG. 5 is a sectional view of the pixel shown in FIG. 4, taken along the line V-V.

An OLED display can have a plurality of gate conductors that include a gate line 121a including first control electrodes 124a and a plurality of second control electrodes 124b are formed on an insulating substrate 110. Insulating substrate 110 can be a suitable substantially transparent materials including, without limitation, glass or plastic.

Gate line 121a extends in a substantially transverse direction. Gate line 121a further includes an end portion 129 having a large area for contact with another layer or with an external driving circuit. First control electrode 124a may project upward from gate line 121a. Gate lines 121a may extend to be directly connected to a gate driving circuit (not shown) for generating the gate signals, which may be integrated on substrate 110. Each of second control electrodes 124b can be separated from gate line 121a. In one embodiment, gate conductors 121a and 124b are made of Al containing metal such as Al and Al alloy, Ag containing metal such as Ag and Ag alloy, Cu containing metal such as Cu and Cu alloy, Mo containing metal such as Mo and Mo alloy, Cr, Ta, Ti, etc. Gate conductors 121a and 124b may have a multi-layered structure including two films having different physical characteristics. One of the two films is made of low resistivity metal including Al-containing metal, Ag-containing metal, or Cu-containing metal, for reducing signal delay or voltage drop. The other film is made of material such as Mo containing metal, Cr, Ta, or Ti, which has good physical, chemical, and electrical contact characteristics with other materials such as indium tin oxide (ITO) or indium zinc oxide (IZO). Good examples of the combination are a lower Cr film and an upper Al (alloy) film and a lower Al (alloy) film and an upper Mo (alloy) film. However, gate conductors 121a and 124b may be made of other various metals or conductors. The lateral sides of gate conductors 121a and 124b can be inclined relative to a surface of substrate 110, with the inclination angle thereof being in the range between about 30 degrees and about 80 degrees. Gate insulating layer 140 can be formed on gate conductors 121a and 124b. Desirably, layer 140 can be made of silicon nitride (SiNx) or silicon oxide (SiOx). Semiconductor stripe 151 and semiconductor island 154b can be formed on gate insulating layer 140, and can be made of hydrogenated amorphous silicon (abbreviated to "a-Si") or polycrystalline silicon. Semiconductor stripe 151 extends substantially in a longitudinal direction and includes a plurality of projections 154a. Semiconductor island 154b can be disposed on second control electrode 124b.

First ohmic contacts 163a and 165a and second ohmic contacts 163b and 165b can be formed on semiconductor stripe 151 and semiconductor island 154b, respectively. First ohmic contacts 163a and 165a are located in pairs on semiconductor stripe 151, and second ohmic contacts 163b and 165b are located in pairs on semiconductor island 154b. In one embodiment, ohmic contacts 163a, 163b, 165a, and 165b include silicide, or n+-hydrogenated a-Si, which can be heavily doped with an n-type impurity, such as phosphorous.

A plurality of data conductors including data line 171a, driving voltage line 172a, and first and second output electrodes 175a and 175b can be formed on ohmic contacts 163a, 163b, 165b, and 165b, and gate insulating layer 140. Data line 171a for transmitting data signals can extend substantially in the longitudinal direction and can intersect gate line 121a. Data line 171a includes first input electrode 173a extending toward first control electrode 124a, and end portion 179 having a large area for contact with another layer, or with an external driving circuit. Data line 171a may extend to be directly connected to a data driving circuit (not shown) for generating the data signals, and may be integrated on substrate 110. Driving voltage line 172a for transmitting driving voltages extends substantially in the longitudinal direction and intersects gate line 121a. Driving voltage line 172a includes a plurality of second input electrodes 173b extending toward second control electrodes 124b.

First and second output electrodes 175a and 175b can be separated from each other and from data line 171a and driving voltage line 172a. Each pair of first input electrodes 173a and first output electrodes 175a are disposed opposite each other with respect to a first control electrode 124a, and each pair of second input electrodes 173b and second output electrodes 175b are disposed opposite each other with respect to a second control electrode 124b. Data conductors 171a, 172a, 175a and 175b can be made of refractory metal including, without limitation, Mo, Cr, Ta, Ti, or alloys thereof. In addition, it may be beneficial to form conductors 171a, 172a, 175a, and 175b in a multi-layered structure including, without limitation, refractory metal film layer and a low resistivity film layer. Suitable exemplary multi-layered structures include, without limitation, a double-layered structure including a lower Cr film layer and an upper Al (Al-alloy) film layer; a double-layered structure including a lower Mo (or Mo-alloy) film layer and an upper Al (alloy) film layer; and a triple-layered structure of a lower Mo (or Mo-alloy) film layer, an intermediate Al (or Al-alloy) film layer, and an upper Mo (or Mo-alloy) film layer. However, data conductors 171a, 172a, 175a and 175b may be made of other suitable conductive materials. Like gate conductors 121a and 124b, data conductors 171a, 172a, 175a and 175b have inclined edge profiles, with the inclination angles thereof being in a range between about 30 degrees and about 80 degrees.

Ohmic contacts 163a, 163b, 165b, and 165b are interposed between the underlying semiconductor members 151 and 154b and overlying data conductors 171a, 172a, 175a and 175b to reduce the contact resistance therebetween. Semiconductor members 151 and 154b may include exposed portions, which are not covered with data conductors 171a, 172a, 175a, and 175b, in the manner by which portions disposed between input electrodes 173a and 173b and output electrodes 175a and 175b are covered.

Passivation layer 180 can be formed on data conductors 171a, 172a, 175a, and 175b, and on the exposed portions of semiconductor members 151 and 154b. It is desirable to make passivation layer 180 of an insulator, and may be an inorganic insulator or an organic insulator. Layer 180 may be configured to have a top surface that is substantially flat. Examples of suitable inorganic insulators include silicon nitride and silicon oxide. Exemplary organic insulators can exhibit a dielectric constant having a value of less than about 4.0; and may exhibit photosensitivity. Passivation layer 180 also may be multilayered, with an exemplary multilayered structure including a lower film layer of an inorganic insulator and an upper film layer of organic insulator, such that it exhibits the excellent insulating characteristics of an organic insulator while preventing damage by the organic insulator to the exposed portions of semiconductor members 151 and 154b. Passivation layer 180 can have contact holes 182, 185a, and 185b exposing end portion 179 of data line 171a, first output electrode 175a, and second output electrode 175b, respectively. Similarly, passivation layer 180 and gate insulating layer 140 can have contact holes 181 and 184 exposing end portion 129 of gate line 121a and second control electrode 124b, respectively. Pixel electrode 191, connecting member 85, and contact assistants 81 and 82 can be formed on passivation layer 180, and can be made of transparent conductor such as ITO or IZO, as well as of a reflective conductor, including without limitation, Al, Ag, and alloys thereof. Pixel electrode 191 is connected to second output electrode 175b through contact holes 185b. Connecting member 85 can be connected to second control electrode 124b and first output electrode 175a through contact holes 184 and 185b, respectively. Connecting member 85 includes storage electrode 87, extending to overlap along a driving voltage line 172a. Contact assistants 81 and 82 can be connected to end portion 129 of gate line 121a and end portion 179 of data line 171a through contact holes 181 and 182, respectively. Contact assistants 81 and 82 protect end portions 129 and 179 and can enhance the adhesion between end portions 129 and 179 and external devices.

It is desirable to form partition 361 on passivation layer 180. Partition 361 can surround pixel electrode 191 to define opening 365, and can be made of organic or inorganic insulating material. Partition 361 may be made of a photosensitive material, which may contain a black pigment so that black partition 361 may serve as a light blocking member and the formation of partition 361 may be simplified.

An OLED display according to embodiments of the present invention can include a plurality of light emitting members, such as light emitting member 370. Light emitting member 370 can be formed on pixel electrodes 191 and generally confined in opening 365 defined by partition 361. Light emitting members 370 can be made of organic material uniquely emitting one of primary color lights such as red, green and blue lights. Such uniquely emitting organic materials are well-known to a person having ordinary skill in the art. Typically, an OLED display displays images by spatially adding the monochromatic primary color lights emitted from energized light emitting members 370. Hereinafter, the pixels representing red, green, and blue lights are referred to respectively as red, green, and blue pixels and denoted respectively by R, G, and B.

Light emitting member 370 may have a multilayered structure including an emitting layer (not shown) for emitting light and auxiliary layers (not shown) for improving the efficiency of light emission of the emitting layer. The auxiliary layers may include an electron transport layer (not shown) and a hole transport layer (not shown) for improving the balance of the electrons and holes. The auxiliary layers also may include an electron-injecting layer (not shown) and a hole-injecting layer (not shown) for improving the injection of the electrons and holes. Common electrode 270 can be formed on light emitting member 370 and partition 361. Common electrode 270 can be supplied with common voltage Vss, and can be made of reflective metal, including without limitation, Ca, Ba, Mg, Al, and Ag, or of a transparent material, including without limitation, ITO and IZO.

In the above-described OLED display, first control electrode 124a connected to a gate line 121a, a first input electrode 153a connected to a data line 171a, and a first output electrode 155a along with a projections 154a of a semiconductor stripe 151 form a switching TFT Qs having a channel formed in projection 154a disposed between first source electrode 173a and first drain electrode 175a. Likewise, a second control electrode 124b connected to a first output electrode 155a, a second input electrode 153b connected to a driving voltage line 172a, and a second output electrode 155b connected to a pixel electrode 191 along with a semiconductor island 154b form a driving TFT Qd having a channel formed in semiconductor island 154b disposed between second source electrode 173b and second drain electrode 175b. Pixel electrode 191, a light emitting member 370, and common electrode 270 form an OLED LD having pixel electrode 191 as an anode and common electrode 270 as a cathode or vice versa. The overlapping portions of storage electrode 127 and driving voltage line 172a form a storage capacitor Cst.

Driving transistor Qd in pixels R, G and B shown in FIGS. 2, 3 and 4 occupy different areas. It is because driving transistors Qd have different channel widths that depend on the emission efficiency of the OLEDs connected thereto. The emission efficiency of the OLEDs is determined by the material. For example, the emission efficiency decreases from green to blue via red. For emitting a given intensity of light, the OLED having lower emission efficiency requires more current and thus driving transistor Qd connected thereto has wider channel width. The channel may be curved or serpentine for obtaining enlarged channel width. The driving current can be also increased by reducing the channel length. Accordingly, driving transistor Qd for green pixel G typically is the largest, that for red pixel R is the second, and that for blue pixel B is the smallest. On the other hand, the areas occupied by the OLEDs of the red, green, and blue pixels R, G, and B are substantially equal to each other for uniform color mixing.

In this way, different areas of driving transistors Qd and equal areas of the OLEDs lead different sizes of pixels R, G and B. For example, pixels R, G and B shown in FIGS. 2, 3 and 4 have different longitudinal lengths.

For the most part, the OLED display can be configured to emit the light toward the top or bottom of substrate 110 to display images. A combination of substantially opaque pixel electrodes 191 and a substantially transparent common electrode 270 can be employed to a top emission OLED display that emits light toward the top of substrate 110. For a bottom emission OLED display that emits light toward the bottom of substrate 110, a combination of substantially transparent pixel electrodes 191 and a substantially opaque common electrode 270 can be employed. If made of polycrystalline silicon, semiconductor members 151 and 154b may include intrinsic regions (not shown) disposed under control electrodes 124a and 124b and extrinsic regions (not shown) disposed opposite each other with respect to the intrinsic regions. A person of ordinary skill in the art would be versed in so disposing both the intrinsic region and the extrinsic region. Where extrinsic regions are electrically connected to input electrodes 173a and 173b and to output electrodes 175a and 175b, ohmic contacts 163a, 163b, 165a and 165b may be omitted. Control electrodes 124a and 124b may be disposed over semiconductor members 151 and 154b. Gate insulating layer 140 is still interposed between semiconductor members 151, and 154b and control electrodes 124a and 124b. Selected embodiments of data conductors 171a, 172a, 173b, and 175b may be disposed on gate insulating layer 140 and electrically connected to semiconductor members 151 and 154b through the contact holes (not shown) in gate insulating layer 140. Otherwise, data conductors 171a, 172a, 173b and 175b may be disposed under semiconductor members 151 and 154b and may electrically contact semiconductor members 151 and 154b.

Figure 6:
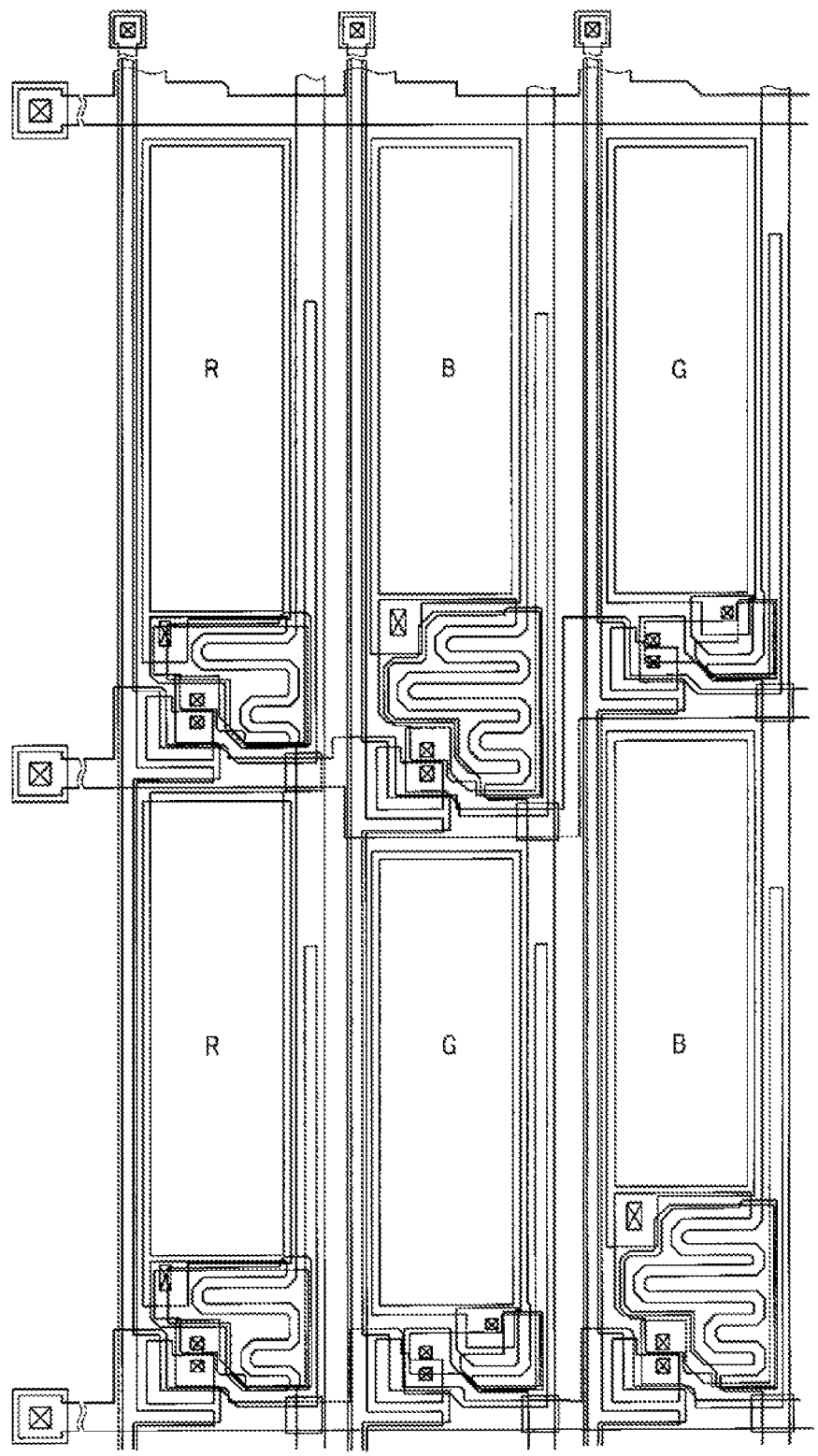
FIG. 6 shows an arrangement of pixels in an OLED display according to an embodiment of the present invention.

An exemplary arrangement of the pixels shown in FIGS. 2, 3 and 4 is described with reference to FIG. 6. FIG. 6 shows an arrangement of a plurality of red pixels R, green pixels G, and blue pixels B. Pixels R, G and B can have different longitudinal lengths. As described above, OLEDs of pixels R, G and B can have substantially equal area, while driving transistors of pixels R, G and B can have different areas.

In one embodiment, pixels R, G and B can be arranged in a matrix. Each row of pixels includes red pixels R, blue pixels B, and green pixels G that are sequentially arranged and have different longitudinal lengths. Columns of pixels include two types of pixel columns. It is desirable that the first type of pixel columns includes the largest pixels (i.e., blue pixels B) and the smallest pixels (i.e., green pixels G) and that the largest pixels and the smallest pixels be alternately arranged. The second type of pixel columns can include only the middle size pixels (i.e., red pixels R). Conveniently, each of pixel rows can have two opposite boundaries, i.e., a curved boundary and a straight boundary. Accordingly, gate lines 121a, which extend along the boundaries of the pixel rows, can include are alternately arranged, and periodically-curved gate lines and straight gate lines.

In general, when sum of the longitudinal lengths of smallest pixel G and largest pixel B is twice the longitudinal length of middle size pixel R, the overall arrangement of pixels R, G and B may be a repetition of the arrangement of two rows. The sequence of the emission efficiency of pixels R, G and B may be varied depending on materials of the pixels, and the present invention can be also applied thereto. An embodiment of the present invention suitably arranges the pixels having different sizes corresponding to the emission efficiency of the OLEDs to obtain both desirable current driving characteristics and a desirable aperture ratio.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. An organic light emitting diode display comprising:
   a first pixel comprising a first light emitting element and a first driving transistor coupled to the first light emitting element,
   a second pixel comprising a second light emitting element and a second driving transistor coupled to the second light emitting element,
   wherein a size of an area occupied by the first driving transistor is different from a size of an area occupied by the first driving transistor, and
   wherein a size of an area occupied by the first light emitting element is substantially equal to a size of an area occupied by the second light emitting element.

2. The organic light emitting diode display of claim 1, wherein the area of the first driving transistor is determined corresponding to an emission efficiency of the first light emitting element, and the area of the second driving transistor is determined corresponding to an emission efficiency of the second light emitting element.

3. The organic light emitting diode display of claim 2, wherein the emission efficiency of the first light emitting element is higher than the emission efficiency of the second light emitting element.

4. The organic light emitting diode display of claim 1, wherein the first pixel emits green light, and the second pixel emits red light.

5. The organic light emitting diode display of claim 1, wherein the first pixel emits red light, and the second pixel emits blue light.

6. The organic light emitting diode display of claim 1, wherein the area occupied by the first driving transistor is smaller than the area occupied by the second driving transistor.

7. The organic light emitting diode display of claim 1, wherein the first driving transistor and the second driving transistor have different channel widths.

8. The organic light emitting diode display of claim 7, wherein at least one of the first and second driving transistors has a serpentine channel.

9. The organic light emitting diode display of claim 7, wherein the first and second driving transistors comprise polycrystalline silicon.

10. The organic light emitting diode display of claim 1, wherein each of the first and second pixels further comprises a switching transistor, the organic light emitting diode display further comprises a gate line and a data line, and the gate line is curved or straight.

11. The organic light emitting diode display of claim 1, wherein the first light emitting element comprises: a first pixel electrode coupled to the first driving transistor; a common electrode facing the first pixel electrode; and a first organic light emitting member interposed between the first pixel electrode and the common electrode, and the second light emitting element comprises: a second pixel electrode coupled to the second driving transistor; the common electrode facing the second pixel electrode; and a second organic light emitting member interposed between the second pixel electrode and the common electrode.

12. The organic light emitting diode display of claim 11, wherein each of the first and second pixels further comprises a switching transistor, the organic light emitting diode display further comprises a gate line and a data line, and the gate line is curved or straight.

13. An organic light emitting diode display comprising:
   a first pixel comprising a first light emitting element and a first driving transistor coupled to the first light emitting element,
   a second pixel comprising a second light emitting element and a second driving transistor coupled to the second light emitting element,
   wherein a size of an area occupied by the first driving transistor is different from a size of an area occupied by the second driving transistor, and
   wherein a size of an area occupied by the first pixel is different from a size of an area occupied by the second pixel.

14. The organic light emitting diode display of claim 13, wherein the area occupied by the first pixel comprises the area occupied by the first driving transistor and an area occupied by the first light emitting element, and the area occupied by the second pixel comprises the area occupied by the second driving transistor and an area occupied by the second light emitting element.

15. The organic light emitting diode display of claim 13, wherein the first pixel emits green light, and the second pixel emits red light.

16. The organic light emitting diode display of claim 13, wherein the first pixel emits red light, and the second pixel emits blue light.

17. The organic light emitting diode display of claim 13, wherein the area occupied by the first driving transistor is smaller than the area occupied by the second driving transistor.

18. The organic light emitting diode display of claim 13, wherein the first driving transistor and the second driving transistor have different channel widths.

19. The organic light emitting diode display of claim 18, wherein at least one of the first and second driving transistors has a serpentine channel.

20. The organic light emitting diode display of claim 18, wherein the first and second driving transistors comprise polycrystalline silicon.

21. The organic light emitting diode display of claim 20, wherein each of the first and second pixels further comprises a switching transistor, the organic light emitting diode display further comprises a gate line and a data line, and the gate line is curved or straight.

22. The organic light emitting diode display of claim 21, wherein the first light emitting element comprises: a first pixel electrode coupled to the first driving transistor; a common electrode facing the first pixel electrode; and a first organic light emitting member interposed between the first pixel electrode and the common electrode, and the second light emitting element comprises: a second pixel electrode coupled to the second driving transistor; the common electrode facing the second pixel electrode; and a second organic light emitting member interposed between the second pixel electrode and the common electrode.

23. The organic light emitting diode display of claim 22, wherein each of the first and second pixels further comprises a switching transistor, the organic light emitting diode display further comprises a gate line and a data line, and the gate line is curved or straight.

\* \* \* \* \*